US010991681B2

(12) United States Patent
Chen et al.

(10) Patent No.: US 10,991,681 B2
(45) Date of Patent: Apr. 27, 2021

(54) THREE-DIMENSIONAL PACKAGE STRUCTURE

(71) Applicant: CYNTEC CO., LTD., Hsinchu (TW)

(72) Inventors: Da-Jung Chen, Taoyuan County (TW); Chun-Tiao Liu, Hsinchu (TW); Chau-Chun Wen, Taoyuan County (TW)

(73) Assignee: CYNTEC CO., LTD., Hsinchu (TW)

( * ) Notice: Subject to any disclaimer, the term of this patent is extended or adjusted under 35 U.S.C. 154(b) by 0 days.

(21) Appl. No.: 16/779,660

(22) Filed: Feb. 2, 2020

(65) Prior Publication Data

US 2020/0176429 A1 Jun. 4, 2020

Related U.S. Application Data

(63) Continuation of application No. 15/409,568, filed on Jan. 19, 2017, now Pat. No. 10,593,656, which is a
(Continued)

(30) Foreign Application Priority Data

Jun. 8, 2007 (TW) .................................. 096120840

(51) Int. Cl.
*H01L 25/16* (2006.01)
*H01L 23/495* (2006.01)
(Continued)

(52) U.S. Cl.
CPC ............ *H01L 25/162* (2013.01); *H01L 23/04* (2013.01); *H01L 23/495* (2013.01); *H01L 23/49517* (2013.01); *H01L 23/49555* (2013.01); *H01L 23/49558* (2013.01); *H01L 23/49562* (2013.01); *H01L 23/49575* (2013.01); *H01L 23/49811* (2013.01); *H01L 23/49861* (2013.01); *H01L 23/552* (2013.01); *H01L 23/645* (2013.01);
(Continued)

(58) Field of Classification Search
CPC .. H01L 23/645; H01L 23/49861; H01L 27/06
See application file for complete search history.

(56) References Cited

U.S. PATENT DOCUMENTS 5,497,033 A * 3/1996 Fillion .................. H01L 21/568
257/723
6,362,964 B1 * 3/2002 Dubhashi ................ H01L 23/24
257/724
(Continued)

*Primary Examiner* — Eugene Lee
(74) *Attorney, Agent, or Firm* — Min-Lee Teng; Litron Patent & Trademark Office

(57) ABSTRACT

A three-dimensional package structure includes an energy storage element, a semiconductor package body and a shielding layer. The semiconductor package body has a plurality of second conductive elements and at least one control device inside. The energy storage element is disposed on the semiconductor package body. The energy storage element including a magnetic body is electrically connected to the second conductive elements. The semiconductor package body or the energy storage element has a plurality of first conductive elements to be electrically connected to an outside device. The three-dimensional package structure is applicable to a POL, (Point of Load) converter.

10 Claims, 8 Drawing Sheets

Related U.S. Application Data continuation-in-part of application No. 13/612,852, filed on Sep. 13, 2012, now Pat. No. 9,601,412, which is a continuation-in-part of application No. 11/847,351, filed on Aug. 30, 2007, now Pat. No. 8,338,928.

(51) Int. Cl.
| | | |
|---|---|---|
| *H01L 23/552* | (2006.01) | |
| *H01L 23/04* | (2006.01) | |
| *H01L 23/498* | (2006.01) | |
| *H01L 23/64* | (2006.01) | |
| *H01L 23/00* | (2006.01) | |
| *H01L 25/10* | (2006.01) | |

(52) U.S. Cl.
CPC .............. *H01L 25/16* (2013.01); *H01L 24/16* (2013.01); *H01L 24/32* (2013.01); *H01L 24/48* (2013.01); *H01L 24/73* (2013.01); *H01L 25/105* (2013.01); *H01L 2224/16245* (2013.01); *H01L 2224/32225* (2013.01); *H01L 2224/32245* (2013.01); *H01L 2224/48091* (2013.01); *H01L 2224/48227* (2013.01); *H01L 2224/48247* (2013.01); *H01L 2224/73265* (2013.01); *H01L 2225/1029* (2013.01); *H01L 2924/00014* (2013.01); *H01L 2924/09701* (2013.01); *H01L 2924/13091* (2013.01); *H01L 2924/181* (2013.01); *H01L 2924/19041* (2013.01); *H01L 2924/19043* (2013.01); *H01L 2924/19105* (2013.01); *H01L 2924/3025* (2013.01)

(56) References Cited

U.S. PATENT DOCUMENTS

| | | | | |
|---|---|---|---|---|
| 6,646,335 | B2* | 11/2003 | Emoto | H01L 23/3107 257/686 |
| 6,781,222 | B2* | 8/2004 | Wu | H01L 23/3128 257/684 |
| 6,975,516 | B2* | 12/2005 | Asahi | H01L 25/50 361/761 |
| 7,141,883 | B2* | 11/2006 | Wei | H01L 23/552 257/778 |
| 7,291,869 | B2* | 11/2007 | Otremba | H01L 23/49575 257/107 |
| 7,321,164 | B2* | 1/2008 | Hsu | H01L 23/5389 257/685 |
| 7,639,513 | B2* | 12/2009 | Otsuki | H01L 23/5387 361/760 |
| 7,977,763 | B2* | 7/2011 | Lin | H01L 24/19 257/516 |
| 2002/0070446 | A1* | 6/2002 | Horiuchi | H01L 21/568 257/723 |
| 2005/0040508 | A1* | 2/2005 | Lee | H01L 23/4985 257/686 |
| 2005/0161793 | A1* | 7/2005 | Ohno | H01L 24/86 257/686 |
| 2005/0168960 | A1* | 8/2005 | Asahi | H01L 25/03 361/761 |
| 2006/0261472 | A1* | 11/2006 | Kimura | H01L 24/97 257/724 |
| 2007/0062027 | A1* | 3/2007 | Ripamonti | H01F 41/046 29/602.1 |
| 2008/0157316 | A1* | 7/2008 | Yang | H01L 24/97 257/685 |
| 2020/0185490 | A1* | 6/2020 | Seidemann | H01L 21/02447 |

* cited by examiner

THREE-DIMENSIONAL PACKAGE STRUCTURE

CROSS-REFERENCES TO RELATED APPLICATIONS

This application is a continuation of U.S. patent application Ser. No. 15,409/568 filed on Jan. 19, 2017, which is a continuation-in-part of U.S. patent application Ser. No. 13/612,852 filed on Sep. 13, 2012, which is a continuation-in-part of U.S. patent application Ser. No. 11/847,351 filed on Aug. 30, 2007, now U.S. Pub. No. 2008/0303125, which claims priority of Taiwan application Ser. No. 096120840 filed on Jun. 8, 2007. The entirety of the above-mentioned patent applications are hereby incorporated by reference herein and made a part of specification.

BACKGROUND OF THE INVENTION

1. Field of the Invention

The present invention generally relates to a package structure, and more particularly to a three-dimensional package structure.

2. Description of the Prior Art

Increasing device complexity but shrinking size is common trend of electrical products. How to put more electrical elements or circuits into a limited space is important for electrical products' designers. Therefore, a three-dimensional package structure is a method to increase the density of the electrical products.

Point-of-Load (POL) converter also can be called as DC/DC converter. A conventional POL converter is packaged by BGA (Ball Grid Array) package or LGA (Land Grid Array) package.

As shown in FIG. 1, a conventional POL converter 1 includes at least one control device 11, at least one MOSFET 13 and a choke coil 15. Take BGA package for example. The control device 11 and the MOSFET 13 and the choke coil 15 are electrically connected to a substrate 17 having electrical circuits, such as printed circuit board, and then packaged to be a POL converter package structure by molding technology.

In the conventional package structure, the control device 11, the MOSFET 13, the choke coil 15, and other devices are disposed on the same horizontal surface of the substrate 17. Therefore, the surface occupied by the devices is pretty large. Moreover, packaging all devices on a single package structure has several disadvantages. For example, once any device inside the package structure is damaged, the whole package structure should be changed. Furthermore, during the operation of the choke coil 15, electric and magnetic are generated which can interfere with the operation of the control device 11. This phenomenon is termed electromagnetic interference (EMI).

SUMMARY OF THE INVENTION

One object of the present invention is to provide a three-dimensional package structure to solve the above-mentioned issues of the conventional package structure.

Another object of the present invention is to provide a three-dimensional package structure having a shielding layer to inhibit or reduce EMI.

Further another object of the present invention is to provide a three-dimensional package structure to improve the heat-dissipating ability.

Further another object of the present invention is to provide a three-dimensional package structure applicable to a POL converter in which devices except a choke coil are packaged inside a semiconductor package body and the choke coil is disposed on the semiconductor package body to be a three-dimensional package structure to reduce the size of the package structure.

In order to reach the above-mentioned purpose, according to one embodiment of the present invention, the three-dimensional package structure comprises a conductive pattern between a first conductive element and a second conductive element. The first conductive element comprises a top surface, a bottom surface and a lateral surface. The conductive pattern disposed on the top surface of the first conductive element. A second conductive element is disposed on the conductive pattern. The first conductive element is electrically connected to the conductive pattern, and the second conductive element is electrically connected to the conductive pattern. In one embodiment, the shielding layer is a portion of the patterned conductive layer.

DETAILED DESCRIPTION OF THE INVENTION

Some embodiments of the invention will now be described in greater detail. Nevertheless, it should be noted that the present invention can be practiced in a wide range of other embodiments besides those explicitly described, and the scope of the present invention is expressly not limited except as specified in the accompanying claims.

Figure 1:
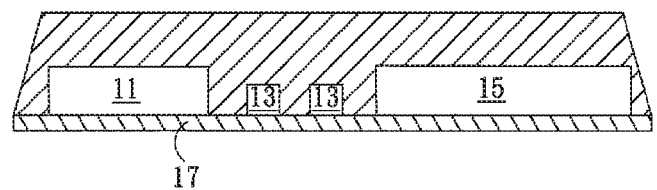
FIG. 1 is a cross-sectional diagram illustrating a package structure of a conventional POL converter.
Figure 2:
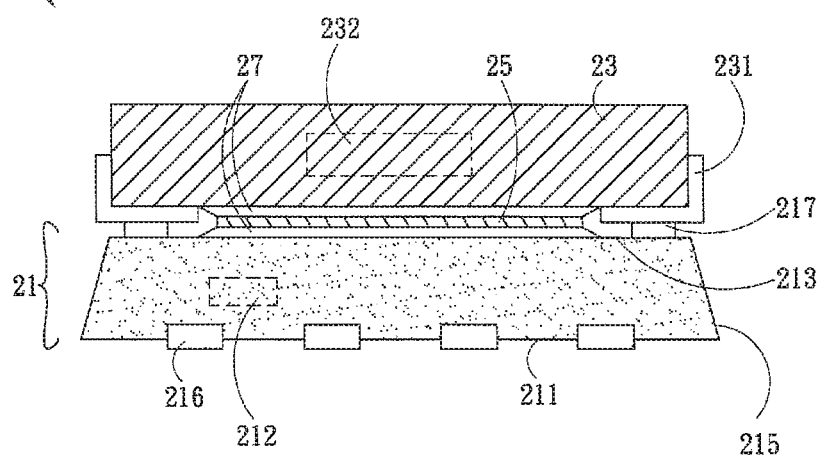
FIG. 2 is a side view illustrating a three-dimensional semiconductor package structure according to an embodiment of the present invention.

As shown in FIG. 2, according to an embodiment of the present invention, a three-dimensional package structure 2 includes a semiconductor package body 21, an energy storage element 23 and a shielding layer 25. The semiconductor package body 21 has a first surface 213, a second surface 211 opposite the first surface 213, and a sidewall 215 interconnecting the first surface 213 and the second surface 211. The semiconductor package body 21 has a plurality of first conductive elements 216 on the second surface 211 or the sidewall 215 to be electrically connected to an outside device (not shown), such as a mother board. The first conductive elements 216 can be, including but not limited to, leads, pads or solder balls. The semiconductor package body 21 further has a plurality of second conductive elements 217 to be electrically connected to the energy storage element 23. The second conductive elements 217 can be disposed on, but not limited to, the first surface 213. The semiconductor package body 21 can be such as, but not limited to, a package body of QFN (Quad Flat No-lead) package, QFP (Quad Flat Package), SSO (Shrink Small Outline) package, BGA (Ball Grid Array) package, and LGA (Land Grid Array) package. The semiconductor package body 21 further includes at least one control device 212 inside, such as a control chip (IC) or a driving chip (IC).

The energy storage element 23 is stacked on the first surface 213 of the semiconductor package body 21. The energy storage element 23 is electrically connected to the second conductive elements 217. In this embodiment, the energy storage element 23 can be such as an inductor having a coil (not shown), a magnetic body 232, and a pair of electrodes 231 electrically connected to the second conductive elements 217. Furthermore, the electrodes 231 can be formed directly by two ends of the coil or two leads connected to the two ends of the coil.

The shielding layer 25 is disposed between the control device 212 and at least part of the magnetic body 232 to inhibit or reduce EMI from the magnetic body 232 on the control device 212. In this embodiment, the shielding layer 25 is disposed between the first surface 213 of the semiconductor package body 21 and the energy storage element 23. The shielding layer 25 can be a metal shielding layer such as a metal foil. The material of the shielding layer 25 can be one of copper, iron, nickel, aluminum. The shielding layer 25 can be fixed between the first surface 213 of the semiconductor package body 21 and the energy storage element 23 by high heat-dissipating adhesive 27 such as epoxy, silicon, silver adhesive or conductive adhesive. Alternatively, a silver adhesive is directly coated between first surface 213 of the semiconductor package body 21 and the energy storage element 23 to form the shielding layer 25.

The following experiments are made on the package structure as is shown in FIG. 2. Suppose that the operation frequency of the control device 212 is 200 kHz. When the shielding layer 25 is a copper foil, the operation frequency of the control device 212 oscillates around 200 to 300 kHz. When the shielding layer 25 is an aluminum foil, the operation frequency of the control device 212 oscillates around 200 to 400 kHz. When there is no shielding layer 25 between the semiconductor package body 21 and the energy storage element 23, the operation frequency of the control device 212 oscillates around 200 to 600 kHz. According to the above-mentioned experiments, during the operation of the control device 212, the magnetic body 232 will interfere the operation of the control device 212 to make the operation frequency of the control device 212 oscillate. By the disposition of the shielding layer 25, the oscillation range of the operation frequency of the control device 212 will be reduced.

Figure 3A:
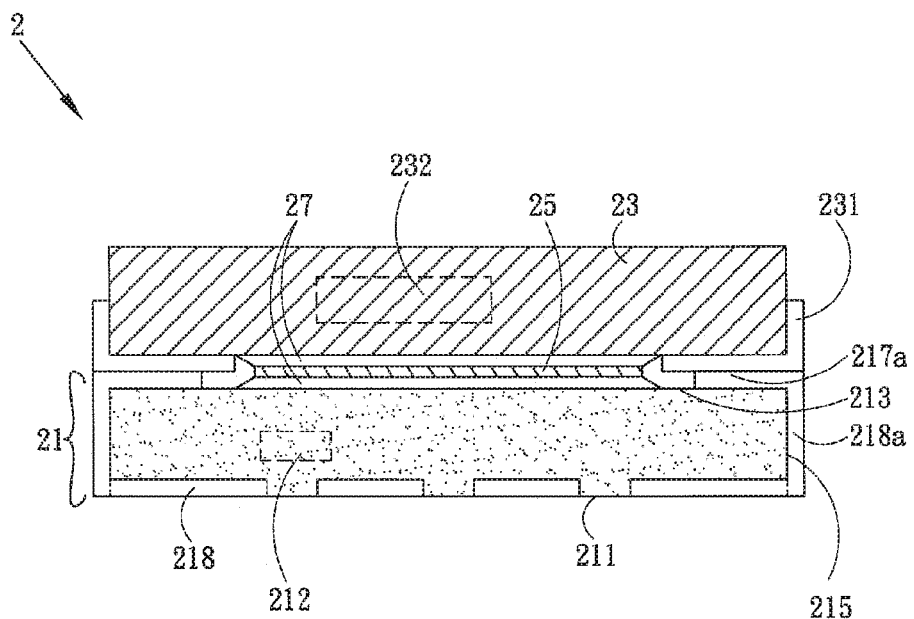
FIG. 3A to FIG. 3D are cross-sectional diagrams illustrating several types of structures of the second conductive elements and a shielding layer of the semiconductor structure according to the present invention.
Figure 3B:
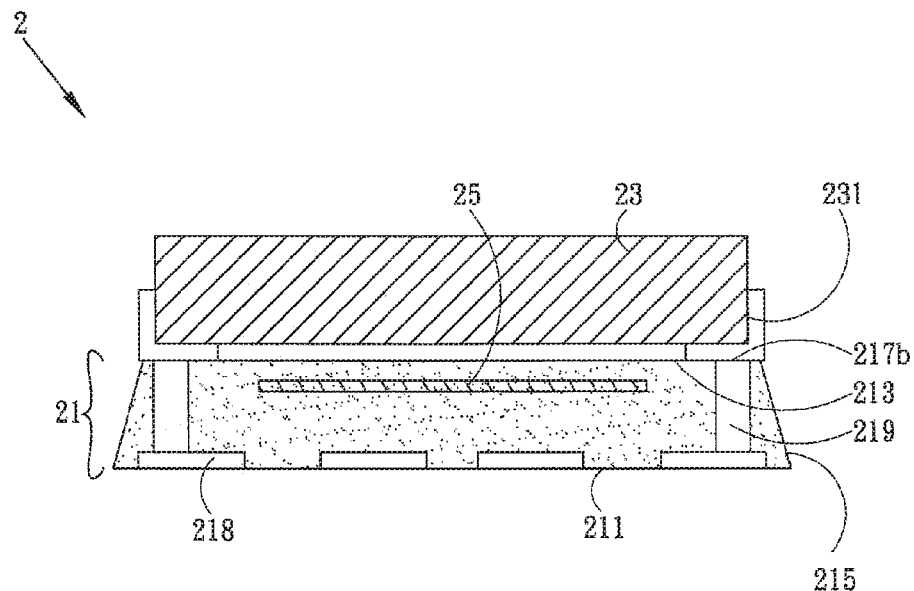
Figure 3C:
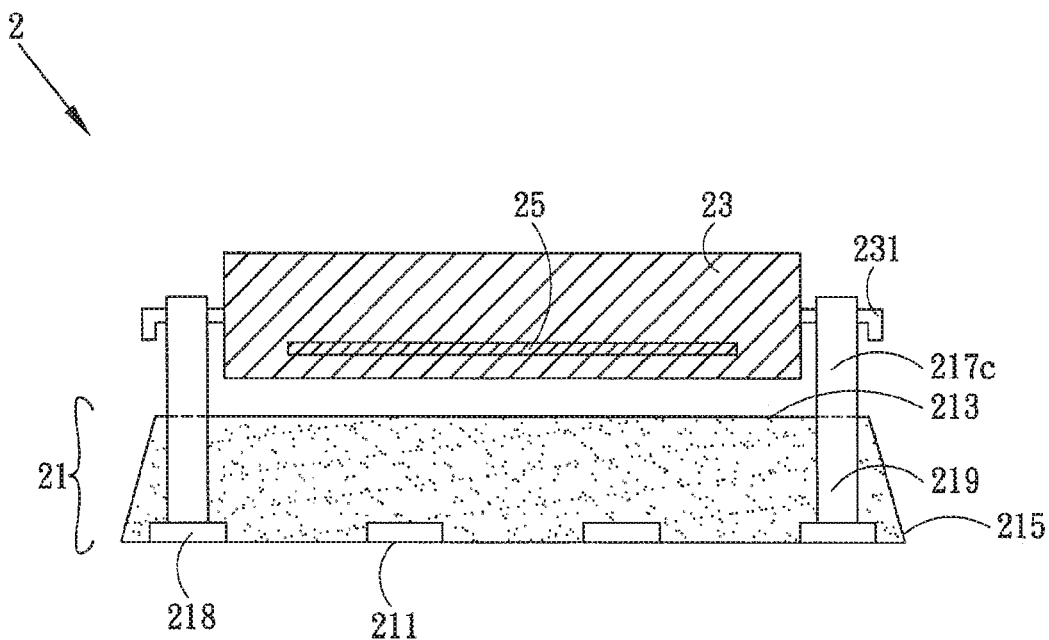

Furthermore, when the shielding layer 25 is a metal foil, there are two disposition methods. First, during the molding process of the semiconductor package body 21 and the energy storage element 23, the shielding layer 25 is disposed inside the semiconductor package body 21 or the energy storage element 23 to make the shielding layer 25 encapsulated inside the semiconductor package body 21 (as shown in FIG. 3B) or inside the energy storage element 23 (as shown in FIG. 3C). Speaking in detail, as shown in FIG. 3B, if the shielding layer 25 is disposed inside the semiconductor package body 21, when the semiconductor package body 21 is electrically connected to the energy storage element 23, the shielding layer 25 can inhibit or reduce the EMI from the energy storage element 23 on the semiconductor package body 21, especially on the control device 212 inside the semiconductor package body 21. As shown in FIG. 3C, the shielding layer 25 is disposed inside the energy storage element 23, when the energy storage element 23 is electrically connected to the semiconductor package body 21, the shielding layer 25 can inhibit or reduce EMI from the energy storage element 23 on the semiconductor package body 21, especially on the control device 212 inside the semiconductor package body 21.

Figure 3D:
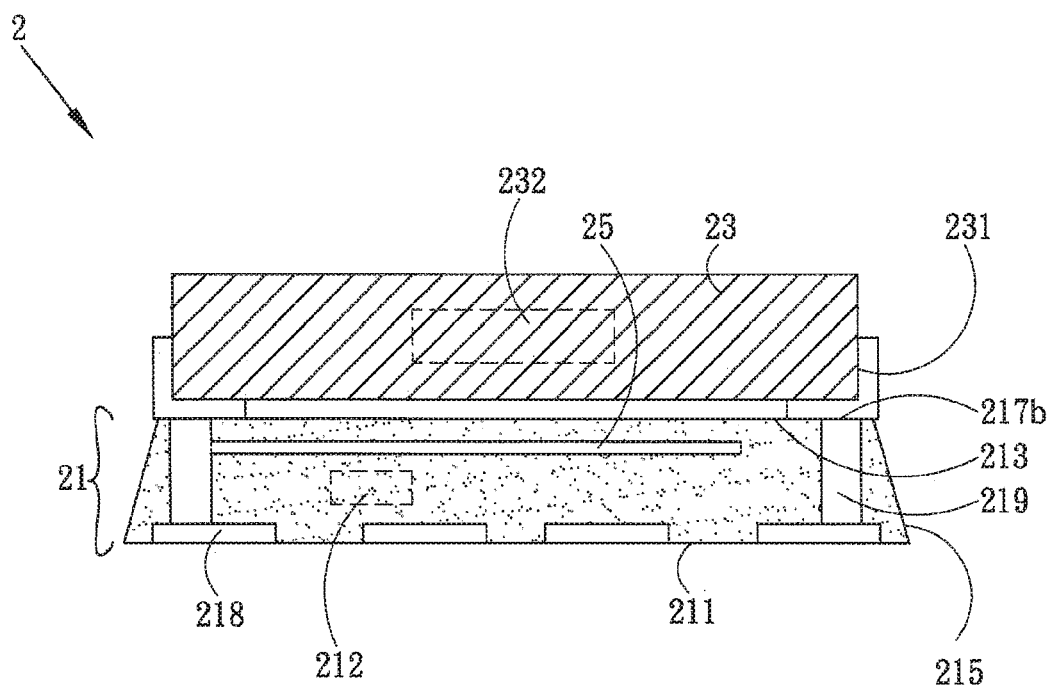

Secondly, the shielding layer 25 can be a part of lead frame 218 of the semiconductor package body 21 or a part of lead frame of the energy storage element 23. As shown in FIG. 3D, during the design of the lead frame 218, a part of the lead frame 218 is in advance kept as the shielding layer 25. During the molding process, the part of the lead frame 218 is bended to lie between the control device 212 and at least part of the magnetic body 232, and then molding process is performed. Alternatively, a part of the lead frame (i.e., electrodes 231) of the energy storage element 23 is bended to lie between the semiconductor package body 21 and the energy storage element 23 to become a shielding layer 25, and then fixed by a high heat-dissipating adhesive 27 on the semiconductor package body 21 or the energy storage element 23.

The method for forming the second conductive elements 217 and the method of the second conductive elements electrically connected to the energy storage element 23 will be described in detail as follows. As shown in FIG. 3A, the first conductive elements 216 are formed by the lead frame 218 of the semiconductor package body 21 (as shown in FIG. 2). At the same time, the leads 218a remained in advance extend outside the semiconductor package body 21. After the molding process on the semiconductor package body 21 is completed, the leads 218a is bended along the sidewall of the semiconductor package body 21 to the first surface 213 of the semiconductor package body 21 to form the second conductive elements 217a. Then, the electrodes 231 (such as leads frame) of the energy storage element 23 are electrically connected and assembled to the second conductive elements 217a by surface mounting technology. Alternatively, as shown in FIG. 3B, a plurality of conductive structures 219 (such as copper pillars) are disposed on the lead frame 218 and extend toward the first surface 213 and are exposed outside the first surface 213 to form the second conductive elements 217b. Then, the second conductive elements 217b are electrically connected to the electrodes 231 (such as lead frame) of the energy storage element 23 by surface mounting technology. Moreover, as shown in FIG. 3C, the conductive structures 219 (such as copper pillars) disposed on the lead frame 218 extends toward the first surface 213 and are exposed outside the first surface 213 to form the second conductive elements 217c. Then, the second conductive elements 217 are electrically connected to the electrodes 231 of the energy storage element 23 by soldering method.

Figure 4A:
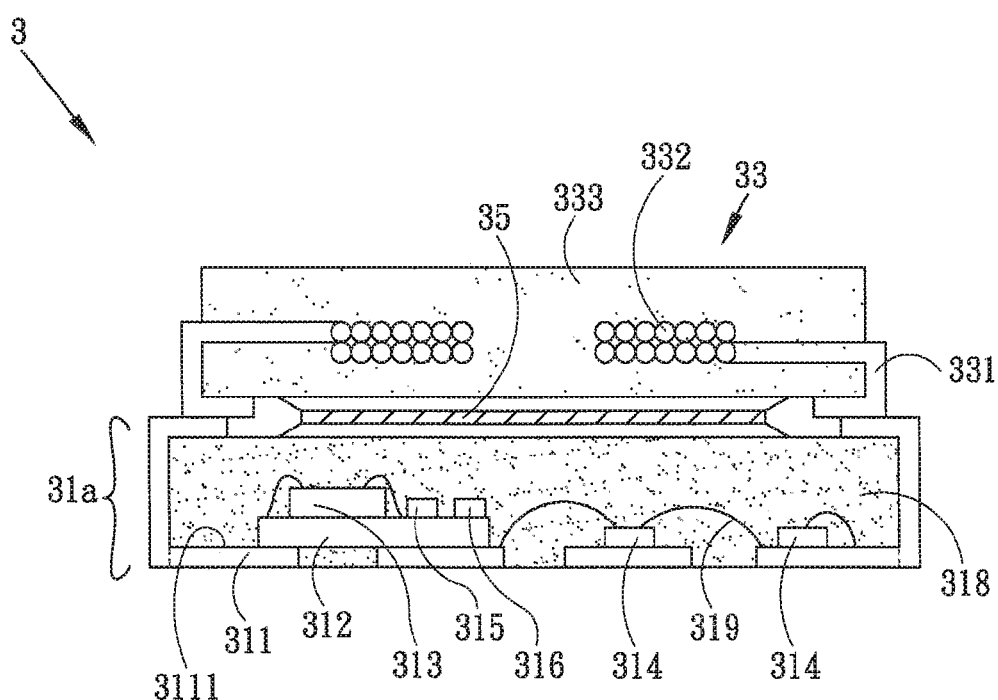
FIG. 4A is a cross-sectional diagram illustrating a three-dimensional package structure according to the present invention.
Figure 4B:
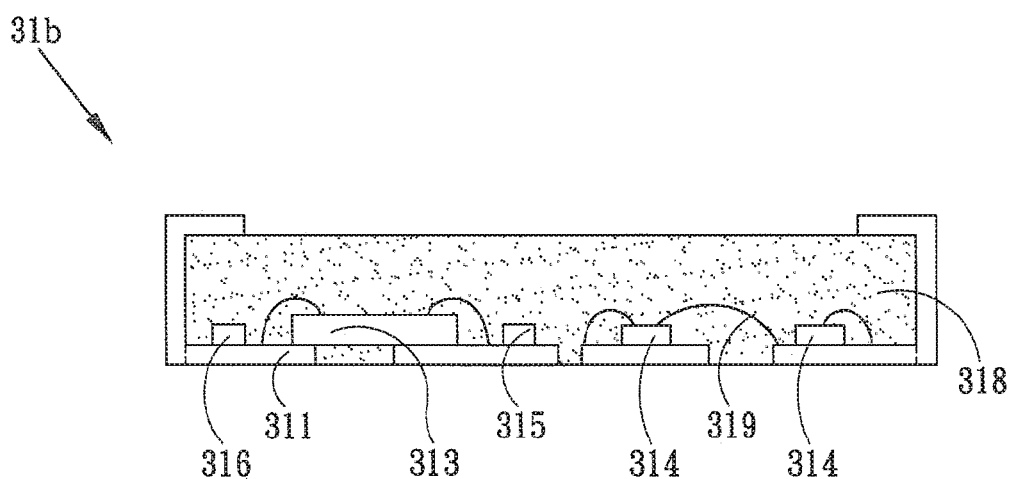
FIG. 4B is a diagram illustrating the structure inside another semiconductor package body.

As shown in FIG. 4A and FIG. 4B, the three-dimensional package structure 2 according to the present invention can be applicable to a POL (Point-of-Load) converter 3 which is also called as a DC/DC converter. The POL converter 3 includes a semiconductor package body 31a (31b), an energy storage element 33, and a shielding layer 35. The details of the corresponding structure relating to the energy storage element 33, the semiconductor package body 31 and the shielding layer 35 are described as above-mentioned three-dimensional package structure 2 including the energy storage element 23, the semiconductor package body 31, and the shielding layer 25. They will not be described anymore.

The structure inside the semiconductor package body 31a (31b) and the energy storage element 33 is shown in FIG. 4A. The semiconductor package body 31a includes a lead frame 311, and a substrate 312, a plurality of devices (such as at least one control device 313, at least one MOSFET 314, a resistor 315, and a capacitor 316), and a molding compound 318 encapsulating the above-mentioned devices, as well as the connection of bonding wires 319. The lead frame 311 is disposed inside a second surface (the second surface 211) of the semiconductor package body 31a. The substrate 312 is mounted on a first surface 3111 of the lead frame 311. Speaking in detail, the substrate 312 is mounted on the lead frame 311 by adhesive (such as silver paste) or by soldering method. The substrate 312 is a substrate having electrical circuits, such as a PCB (Printed Circuit Board), to increase electrical circuit density. A part of the devices of the POL inverter 3 can be mounted on the substrate 312 and others can be mounted on the lead frame 311 to reduce the occupied surface of the lead frame 311 and to get a smaller surface of the semiconductor package body 31a. The devices on the substrate 312 can be electrically connected to the electrical circuits of the substrate 312 by bonding wires 319 or by flip-chip method. Then, the electrical circuits of the substrate 312 are electrically connected to the lead frame 311 or the devices on the lead frame 311 by bonding wires 319. The devices on the lead frame 311 are electrically connected to the lead frame 311 by bonding wires 319 or flip-chip method. In this embodiment, a control device 313 and passive devices (such as a resistor 315 and a capacitor 316) are mounted on the substrate 312. The power devices (such as at least one MOSFET 314) are disposed on the lead frame 311. Because the lead frame 311 has a heat-dissipating ability, the power devices mounted on the lead frame can get a better heat-dissipating effect than those mounted on the substrate.

Furthermore, the device such as control device, power device, can be attached on the substrate or the lead frame by soldering method. After soldering the device and before encapsulating the devices by the molding compound 318, an under-fill material (not shown) is injected into a gap between the device and the substrate 312 or the lead frame 311 and thereby extends solder joint life by limiting relative displacement between the device and the substrate or the lead frame during thermal cycling.

The energy storage element 33 can be a choke coil including electrodes 331, a coil 332, and a magnetic body 333. The magnetic body 333 encapsulates the coil 332. The electrodes 331 extend outside the magnetic body 333. The electrodes 331 can directly be formed by two ends of the coil 332 or by lead frame connected to two ends of the coil 332.

Alternatively, as shown in FIG. 4B, the structure inside the semiconductor package body 31b is disclosed herein. The semiconductor package body 31b includes a lead frame 311, at least one control device 313, at least one MOSFET 314, a resistor 315, and a capacitor 316, and a molding compound 318 encapsulating the above-mentioned devices, as well as the connection of bonding wires 319. The control device 313, the MOSFET 314, the resistor 315, and the capacitor 316 are directly mounted on the lead frame 311. The control device 313, the MOSFET 314, the resistor 315, and the capacitor 316 are electrically connected to the lead frame 311 by bonding wires 319.

In order to accommodate the heat dissipation requirement, the energy storage element can be vertically stacked on the semiconductor package body or the semiconductor package body can be vertically stacked on the energy storage element.

The following description describes another embodiment of the present invention. In the embodiment, a semiconductor package body is stacked on and electrically connected to an energy storage element and the energy storage element has a plurality of conductive elements to be electrically connected to an outside device, such as a mother board.

Figure 5:
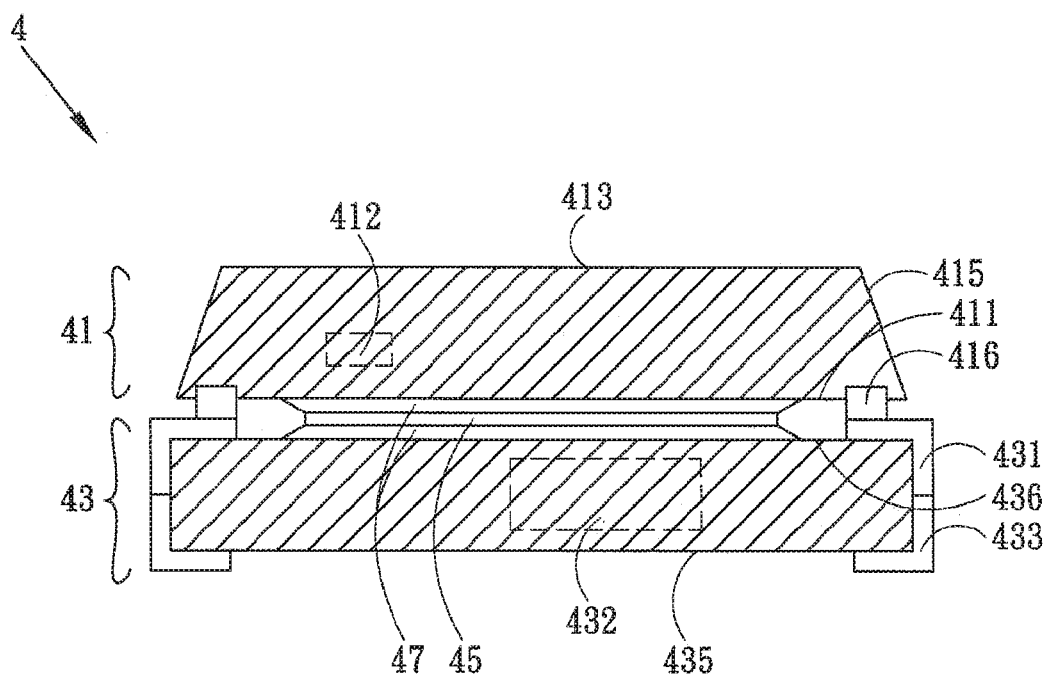
FIG. 5 is a side view illustrating a three-dimensional semiconductor package structure according to another embodiment of the present invention.

As shown in FIG. 5, according to another embodiment of the present invention, a three-dimensional package structure 4 includes a semiconductor package body 41, an energy storage element 43 and a shielding layer 45. The semiconductor package body 41 has a first surface 411, a second surface 413 opposite the first surface 411, and a sidewall 415 interconnecting the first surface 411 and the second surface 413. The semiconductor package body 41 has a plurality of second conductive elements 416 on the first surface 411 or the sidewall 415 to be electrically connected to the energy storage element 43. The second conductive elements 416 can be such as leads, pads or solder balls. The semiconductor package body 41 can be such as a package body of QFN, QFP, SSO, BGA package, or LGA package. The semiconductor package body 41 further includes at least one control device 412 inside, such as a control chip (IC) or a driving chip (IC).

In this embodiment, the energy storage element 43 can be such as an inductor having a coil (not shown), a magnetic body 432, and a plurality of third conductive elements 431 to be electrically connected to the second conductive elements 416 of the semiconductor package body 41. Hence, the semiconductor package body 41 is stacked on and electrically connected to the third conductive elements 431 of the energy storage element 43. The energy storage element 43 further has a plurality of first conductive elements 433 used to be electrically connected to an outside device, such as a mother board. The third conductive elements 431 and the first conductive elements 433 can be leads of a lead frame inside the energy storage element 43. The lead frame can be also connected to the two ends of the coil.

Furthermore, the shielding layer 45 is disposed between the control device 412 and at least part of the magnetic body 432 to inhibit or reduce EMI from the magnetic body 432 on the control device 412. In this embodiment, the shielding layer 45 is disposed between the first surface 411 of the semiconductor package body 41 and the energy storage element 43. The shielding layer 45 can be a metal shielding layer such as a metal foil. The material of the shielding layer 45 can be copper, iron, nickel or aluminum. The shielding layer 45 can be fixed between the first surface 413 of the semiconductor package body 41 and the energy storage element 43 by high heat-dissipating adhesive 47 such as epoxy, silicon, silver adhesive or conductive adhesive. Alternatively, a silver adhesive is directly coated between the semiconductor package body 41 and the energy storage element 43 to form the shielding layer 45.

Alternatively, in this embodiment, the shielding layer 45 can be disposed inside the energy storage element 43 to make the shielding layer 45 encapsulated inside the energy storage element 43 (not shown) It can be manufactured by above-mentioned method, and will not be described in detail anymore. Therefore, the shielding layer can inhibit or reduce the EMI from the energy storage element 43 on the semiconductor package body 41, especially the control device 412 inside the semiconductor package body 41.

Figure 6A:
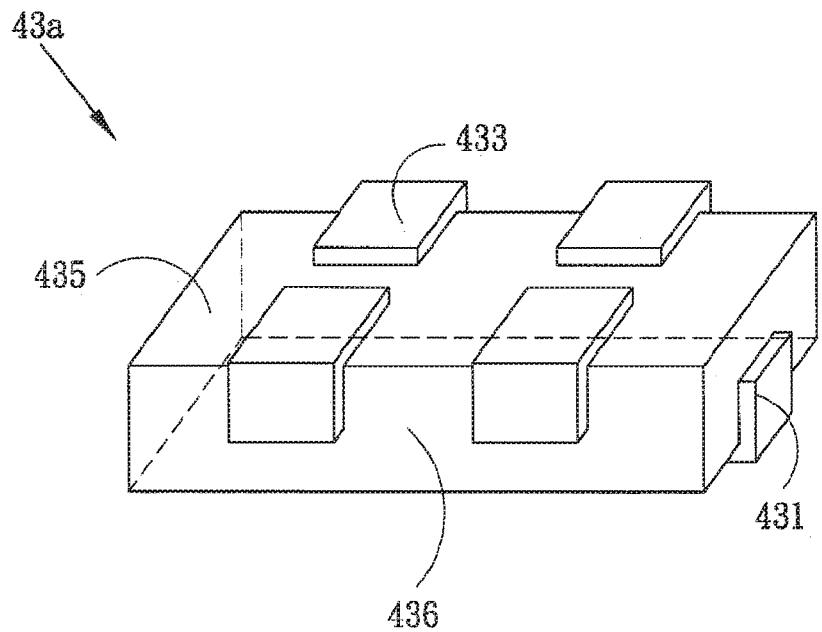
FIGS. 6A to 6C are perspective diagrams illustrating the conductive elements of the energy storage element according to the three-dimensional package structure of FIG. 5.
Figure 6B:
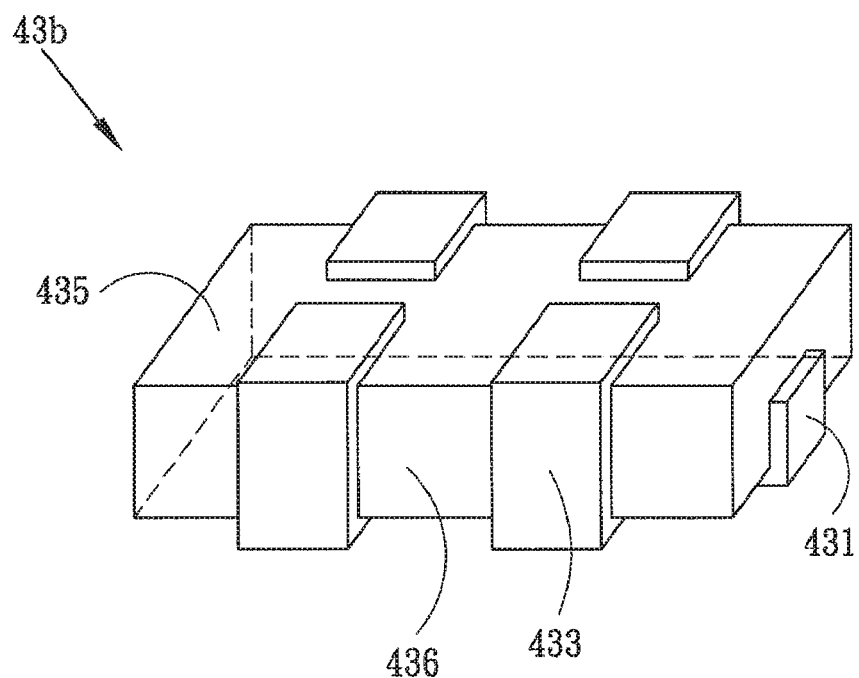
Figure 6C:
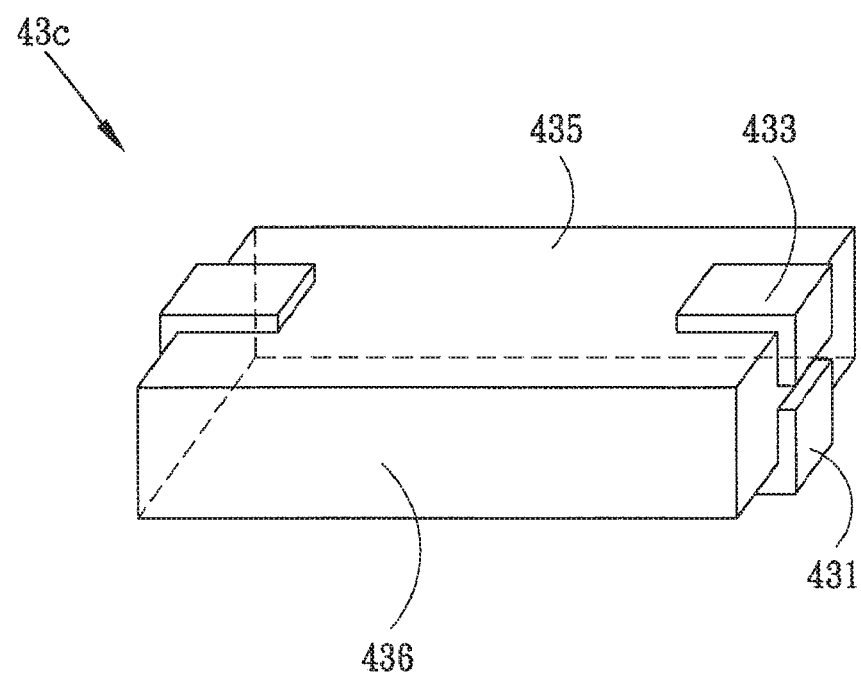

FIGS. 6A to 6C are perspective diagrams illustrating the conductive elements of the energy storage elements 43a, 43b, and 43c according to another embodiment of the present invention. The energy storage element 43a, 43b, 43c with a third surface 435 and a fourth surface 436 opposite the third surface 435 includes a plurality of first conductive elements 433 and a plurality of third conductive elements 431. The first conductive elements 433 and the third conductive elements 431 are leads of at least one lead frame inside the energy storage element. As shown in FIG. 6A, the first conductive elements 433 and the third conductive elements 431 extend out of the energy storage element 43a from its sidewall. The first conductive elements 433 are bended to the third surface 435 to be electrically connected to the outside device. The third conductive elements 431 are bended to the fourth surface 436 to be electrically connected to the semiconductor package body 41. As shown in FIG. 6B, the first conductive elements 433 extend from the third surface 435 to the fourth surface 436. As shown in FIG. 6C, the first conductive elements 433 and the third conductive elements are extended out of the energy storage element from the same sidewall, and the first conductive elements 433 are bended to the third surface 435 to be electrically connected to the outside device, and the third conductive elements 431 are bended to the fourth surface to be electrically connected to the semiconductor package body 41.

Figure 7A:
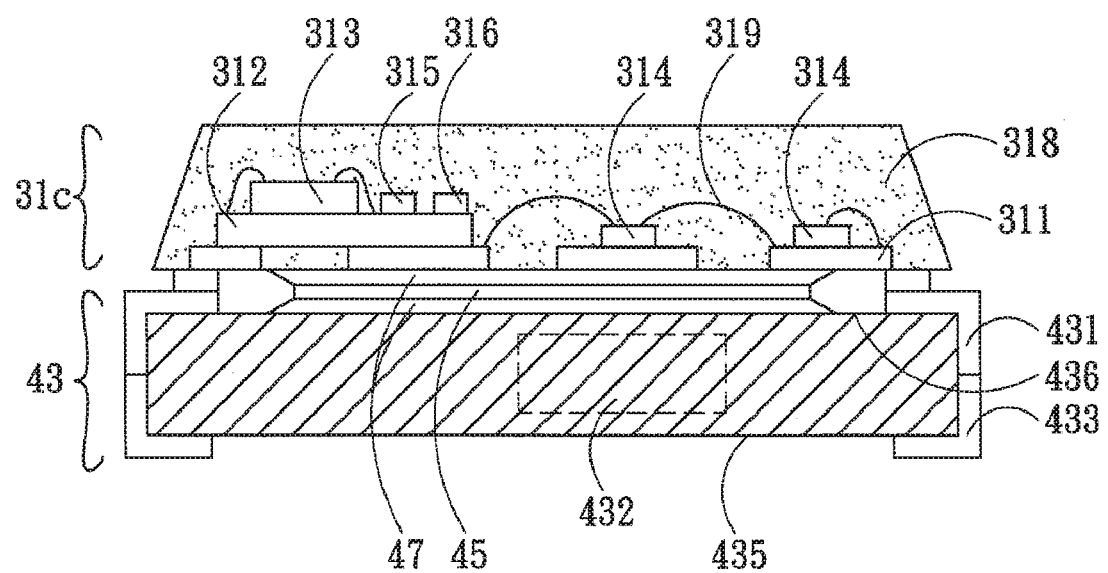
FIGS. 7A to 7C are cross-sectional diagrams illustrating the three-dimensional package structure of FIG. 5.
Figure 7B:
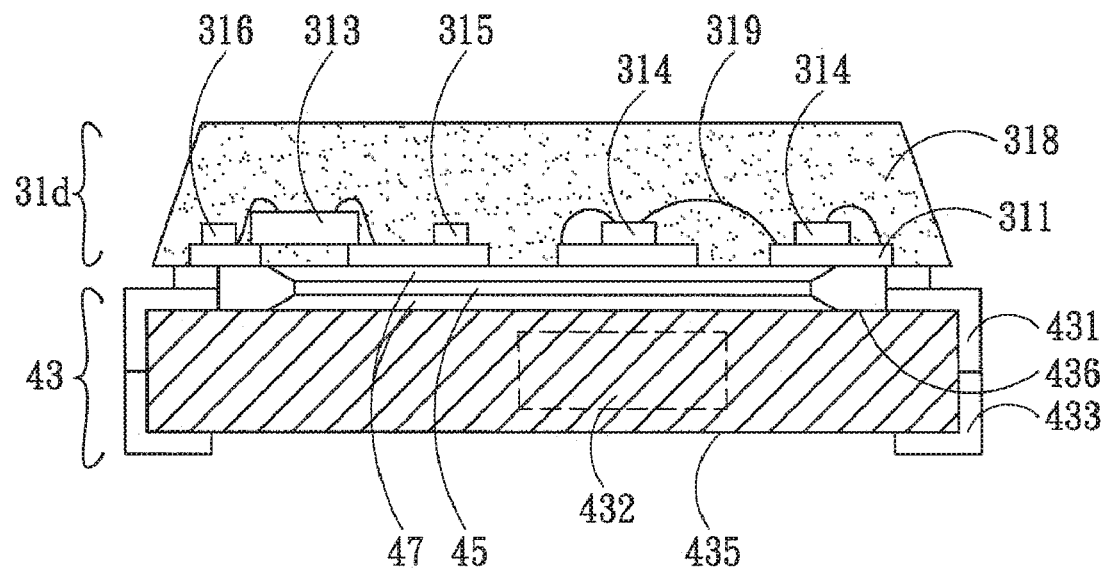
Figure 7C:
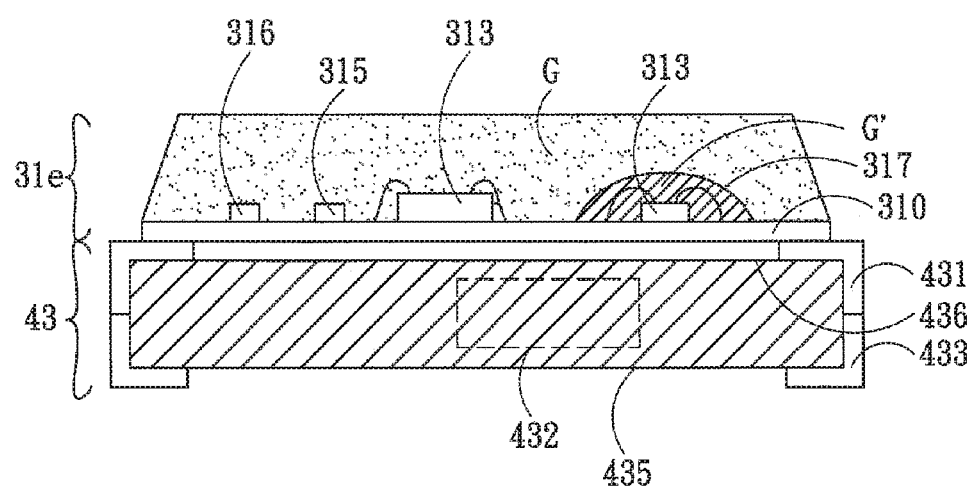

As shown in FIGS. 7A to 7C, the three-dimensional package structure 4 according to the present invention can be applicable to a POL converter, which is also called as a DC/DC converter. As shown in FIG. 7A, the semiconductor package body 31c, similar to the semiconductor package body 31a, includes a lead frame 311, and a substrate 312 and a plurality of devices (such as at least one control device 313, at least one MOSFET 314, a resistor 315, and a capacitor 316). The substrate 312 with electrical circuits can be a multi-layer PCB having a metal layer for serving as the shielding layer. Alternatively, a first surface of the control device 313 is flip-chipped on and electrically connected to the substrate 312, and a second surface of the control device 313 opposite the first surface of the control device 313 has a metal layer thereon for serving as the shielding layer.

As shown in FIG. 7B, the semiconductor package body 31d, similar to the semiconductor package body 31b, includes a lead frame 311, at least one control device 313, at least one MOSFET 314, a resistor 315, and a capacitor 316. The above-mentioned elements, as well as the connection of bonding wires 319, are protected by a molding compound 318. The detailed structures inside the semiconductor package bodies 31c, 31d will not be described again.

In this embodiment, as shown in FIG. 7C, a semiconductor package body 31e is disclosed herein. The semiconductor package body 31e includes a substrate 310 with devices mounted thereon. The substrate 310 with electrical circuits is such as a PCB. The devices include at least one control device 313, at least one MOSFET 314, resistor 315, and capacitor 316. The MOSFET 314, as well as the connection of thin wires 317, is protected by a seal layer G'. The control device 313, the resistor 315, and the capacitor 316, and the seal layer G' is protected by an outer seal layer G The semiconductor package body 31e is electrically connected to the energy storage element 43.

In the present invention, the three-dimensional package structure assembled by vertical stacking can solve the problem of the conventional package structure having all devices on the same horizontal surface to get a tinier package structure. Furthermore, the substrate with electrical circuits inside the semiconductor package body has an advantage of high electrical-circuit density. Therefore, it is allowable to have high density circuit design inside a tiny volume to meet the requirement of miniaturization.

The three-dimensional package structures according to the present invention are applicable to a POL converter. Except the choke coil, the devices are all packaged inside a semiconductor package body. Then, the choke coil is vertically connected to the semiconductor package body to form a three-dimensional package structure to get a tiny package structure.

In the present invention, the choke coil and the semiconductor package body are two independent elements. It can meet different users' requests on electricity and package size. Therefore, it is easy for users to make most appropriate combination and arrangement and to add variety and to reduce the risk of slow moving item and to increase flexibility. Compared to the conventional package structure, all devices are molded inside a single package structure. Once any one device is damaged, the package structure should be changed. Therefore, it will cause the waste of materials.

Although specific embodiments have been illustrated and described, it will be appreciated by those skilled in the art that various modifications may be made without departing from the scope of the present invention, which is intended to be limited solely by the appended claims.

What is claimed is:

1. A method to form an electronic module, the method comprising:
   providing a substrate, wherein a plurality of electronic devices are disposed over the substrate;
   forming a unitary packaging body to encapsulate the plurality of electronic devices and at least one portion of the substrate, wherein a first conductive element and a second conductive element are disposed on and in contact with the unitary packaging body; and
   disposing an energy storage element over the unitary packaging body, wherein the energy storage element comprises a magnetic body and a coil disposed inside the magnetic body, wherein a first electrode and a second electrode of the energy storage element are disposed on the magnetic body, wherein the magnetic body is disposed over the unitary packaging body with the first electrode and the second electrode being electrically connected to and in contact with the first conductive element and the second conductive element disposed on the unitary packaging body, respectively.

2. The method according to claim 1, wherein the energy storage element is a choke.

3. The method according to claim 1, wherein the plurality of electronic devices comprises an IC, a first MOSFET and a second MOSFET.

4. The method according to claim 1, wherein a horizontal gap is between two electronic devices of the plurality of electronic devices, and a contiguous portion of the unitary packaging body occupies the entire horizontal gap between said two electronic devices.

5. The method according to claim 1, wherein the energy storage element is a discrete inductor.

6. The method according to claim 1, wherein the substrate is a lead frame.

7. The method according to claim 1, wherein the substrate is a PCB.

8. The method according to claim 1, wherein the substrate is a lead frame, wherein a PCB is disposed on the lead frame, wherein at least one electronic device of the plurality of electronic devices is disposed on the PCB.

9. The method according to claim 1, wherein the plurality of electronic devices comprises at least one MOSFET.

10. The method according to claim 1, wherein the plurality of electronic devices comprises at least one control device and at least one MOSFET.

* * * * *